(12) United States Patent
Hsieh

(10) Patent No.: US 7,956,410 B2
(45) Date of Patent: Jun. 7, 2011

(54) TRENCH MOSFET WITH TRENCH GATES UNDERNEATH CONTACT AREAS OF ESD DIODE FOR PREVENTION OF GATE AND SOURCE SHORTAGE

(75) Inventor: Fu-Yuan Hsieh, HsinChu (TW)

(73) Assignee: Force Mos Technology Co. Ltd., Hsinchu (TW)

( * ) Notice: Subject to any disclaimer, the term of this patent is extended or adjusted under 35 U.S.C. 154(b) by 0 days.

(21) Appl. No.: 12/785,085

(22) Filed: May 21, 2010

(65) Prior Publication Data

US 2010/0224931 A1 Sep. 9, 2010

Related U.S. Application Data

(63) Continuation of application No. 12/036,248, filed on Feb. 23, 2008, now abandoned.

(51) Int. Cl.
*H01L 27/06* (2006.01)
(52) U.S. Cl. ......... 257/328; 257/330; 257/331; 257/332
(58) Field of Classification Search ................. 257/328, 257/330–332, E27.016; 438/212, 268
See application file for complete search history.

(56) References Cited

U.S. PATENT DOCUMENTS

| | | | | |
|---|---|---|---|---|
| 6,657,256 B2 * | 12/2003 | Hshieh et al. | ................. | 257/339 |
| 6,861,701 B2 * | 3/2005 | Williams et al. | .............. | 257/329 |
| 7,345,342 B2 * | 3/2008 | Challa et al. | ................. | 257/341 |
| 2008/0121988 A1 * | 5/2008 | Mallikararjunaswamy et al. | ............................ | 257/328 |

* cited by examiner

*Primary Examiner* — Wai-Sing Louie
*Assistant Examiner* — Sue Tang
(74) *Attorney, Agent, or Firm* — Grace Lee Huang; Arch Equity Holdings, LLC

(57) ABSTRACT

A trench DMOS transistor employing trench contacts has overvoltage protection for prevention of shortage between gate and source, comprising a plurality of first-type function trenched gates, at least one second-type function trenched gate and at least two third-type function trenched gates extending through body regions and into an epitaxial layer. The first-type function trenched gates are located in active area surrounded by a source region encompassed in the body region in the epitaxial layer for current conduction. The second-type function trenched gates are disposed underneath a gate metal with a gate trenched contacts filled with metal plug for gate metal connection. The third type function trenched gates are disposed directly and symmetrically underneath ESD trenched contact areas of anode and cathode in an ESD protection diode, serving as a buffer layer for prevention of gate-body shortage.

7 Claims, 12 Drawing Sheets

TRENCH MOSFET WITH TRENCH GATES UNDERNEATH CONTACT AREAS OF ESD DIODE FOR PREVENTION OF GATE AND SOURCE SHORTAGE

This is a continuation of U.S. Ser. No. 12/036,248 entitled "Trench Mosfet with Trench Gates Underneath Contact Areas of ESD Diode for Prevention of Gate and Source Shortage" filed Feb. 23, 2008, now abandoned which application is hereby incorporated by reference in its entirety.

FIELD OF THE INVENTION

This invention relates generally relates to the device configuration and fabrication process of trench MOSFET transistors. More particularly, this invention relates to a improved device configuration for manufacturing DMOS transistors with electrostatic discharge (ESD) protection having additional trenched gates underneath ESD trenched contacts of the ESD diode for preventing gate and source shortage.

BACKGROUND

Conventional technologies still have technical difficulties in dealing with the electrostatic discharge (ESD) problems in designing, manufacturing and implementing the semiconductor power devices. Specially, the high voltage transient signal from static discharge in a DMOS device can impose a voltage bias higher than 10,000 volts. The high electric field induced by the bias voltage when imposed on a relatively thin layer of gate dielectric layer often leads to hazardous conditions to the DMOS device. The thin layer of gate dielectric is most commonly implemented as an oxide layer. Under a high electric field, rupture is induced in the oxide layer that functions as an insulator. A permanent damage is thus introduced into a system implemented with the power semiconductor device. The reliability of system performance and operations suffer due this ESD problem. This problem is particularly pronounced in high voltage DMOS devices. Many ESD protective measures are implemented. DMOS devices are often designed and manufactured with self-contained ESD protection systems comprising multiple back to back Zener diodes as shown in FIG. 1. The ESD protection circuits can be implemented either as a discrete circuit or as an integrated part of the semiconductor power devices.

FIG. 1 shows the circuit equivalent for a typical N-channel DMOS in which a back to back Zener diode as ESD (Electrostatic Discharge) protection diode is located between the source and gate of the DMOS. The ESD protection diode breaks down when the gate to source voltage exceeds a specified voltage value.

FIG. 2 and FIG. 3 illustrate an example of a conventional trench DMOS structure having ESD protection and its disadvantage.

Refer to FIG. 2, which is about U.S. Pat. No. 6,657,256 and No. 6,884,683, the structure includes an n+ substrate 200 on which is grown a lightly n-doped epitaxial layer 204. Within doped epitaxial layer 204, a body region 216 of opposite conductivity is provided. An n-doped layer 240 that overlies most of the body region 216 serves as the source. A rectangularly shaped trench 224 is provided in the epitaxial layers. A gate oxide layer 230 lines the sidewalls of the trench 224. The trench 224 is filled with polysilicon 252. An ESD protection poly diode is two back to back Zener diode comprising two n+ regions 245 and one P region 248. A thin layer of oxide is formed underneath the ESD protection diode acting as the insulating layer, as shown in FIG. 2.

FIG. 3 shows the disadvantage of the DMOS structure of FIG. 2 when trenched contacts into the epitaxial layer and the ESD diode are applied. The ESD protection diode is shorted with body-source region as a result of the doped poly overetching region 260, and the insulator etch-through caused by poor etching selectivity of the oxide over the doped poly.

One problem with the device shown in the previously mentioned patent is that when trench contacts are applied for source and gate, it requires additional Si trench etch procedure as shown on FIG. 2. Such arrangement will encounter the problem including the ESD diode shorting with body-source and therefore result in low yield and product reliability as shown on FIG. 3. The shortage is resulted from etch through ESD diode poly and thin oxide underneath mentioned above, which will result in permanent damage to the device.

There is a need in the art for a system and method for providing overvoltage protection to prevent the ESD shortage problems in connection in the design of trench DMOS transistor.

SUMMARY OF THE INVENTION

Various embodiments of the present invention are disclosed. In one embodiment, the present invention provides a trench DMOS transistor with ESD trenched contact configuration which provides overvoltage protection and the ability to avoid ESD shorting with source.

In another embodiment, the transistor includes a substrate of a first conductivity type and a body region of a second conductivity type formed over the substrate. Trenches extend through the body region and substrate. A first insulating layer lines the trenches as gate oxide. A conductive material is deposited in the trenches so that it overlies the first insulating layer. A source region of the first conductivity type is formed in the body region adjacent to the trench. A doped polysilicon layer overlies a portion of a second insulating layer as an ESD protection diode comprising multiple back to back Zener diodes. The ESD protection diode comprising an array of doped regions comprising doped regions doped alternately with a first conductivity type and a second conductivity type with a first and last doped regions doped with a first conductivity type wherein one of the two doped regions connected to the source metal and another one of the two doped regions connected to the gate metal of the semiconductor power device. Specially, underneath contact areas of the ESD diode in FIG. 4, trenched gates are formed. The trenched gates serve as a buffer layer to avoid ESD shorting source and gate.

In another embodiment, trench MOSFET comprising three type function trenched gates. The first type function trenched gates are located in active area surrounded by a source region encompassed in a body region in an epitaxial layer for current conduction. The second type function trenched gates are disposed underneath a gate metal with a gate trenched contacts filled with metal plug for gate metal connection. The third type function trenched gates are disposed directly and symmetrically underneath ESD trenched contact areas of anode and cathode in an ESD protection diode, serving as a buffer layer for prevention of gate-body shortage. The third type function trenched gates are surrounded with body region.

Still in another embodiment, the doped polysilicon layer overlies a portion of the insulating layer that is vertically displaced from the body region.

In another embodiment, the ESD protection diode formed with plurality of the first conductivity and second conductivity doped regions is disposed on the second insulating layer vertically separated from the third type trenched gates.

In accordance with yet another aspect of the invention, the source region and plurality of the first conductivity type regions in the second conductivity type doped poly are formed in simultaneous deposition steps.

In one embodiment of the present invention, a trench DMOS transistor having overvoltage protection, comprising: a substrate having a first conductivity type; an epitaxial layer grown on the substrate; a body region disposed within the epitaxial layer having a second conductivity type, comprising a plurality of first-type function trenched gates, at least one second-type function trenched gate and at least two third-type function trenched gates extending through the body region and into the epitaxial layer; a doped polysilicon layer filled in the first, second and third-type function trenched gates over a gate oxide served as first, second and third type function trenched gates; wherein the second-type function trenched gate with the doped polysilicon layer having gate trenched contact filled with metal plug connecting to gate metal; wherein the third-type function trenched gate is disposed in a manner directly and symmetrically underneath the ESD trenched contact areas of anode and cathode in a ESD protection diode as a buffer layer; a source region of the first conductivity type encompassed entirely within the body region disposed in the active area adjacent to at least one side of the first-type function trenched gates; an insulating layer lining over the first, second and third-type function trenched gates and overlying the body region and the source region; wherein the ESD protection diode comprises multiple back to back polysilicon Zener diodes disposed on top of the insulating layer wherein the anode and cathode areas have ESD trenched contacts filled with the metal plug, having trench width of the trenched contacts not greater than the third-type function trenched gates; and a source-body trenched contact formed between two adjacent the first-type function trenches filled with the metal plug having a heavily doped region surrounding the source-body trenched contact below the source region with a same doping type as the body region; wherein the heavily doped region is disposed in a manner spaced apart from the epitaxial layer under the ESD protection diode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
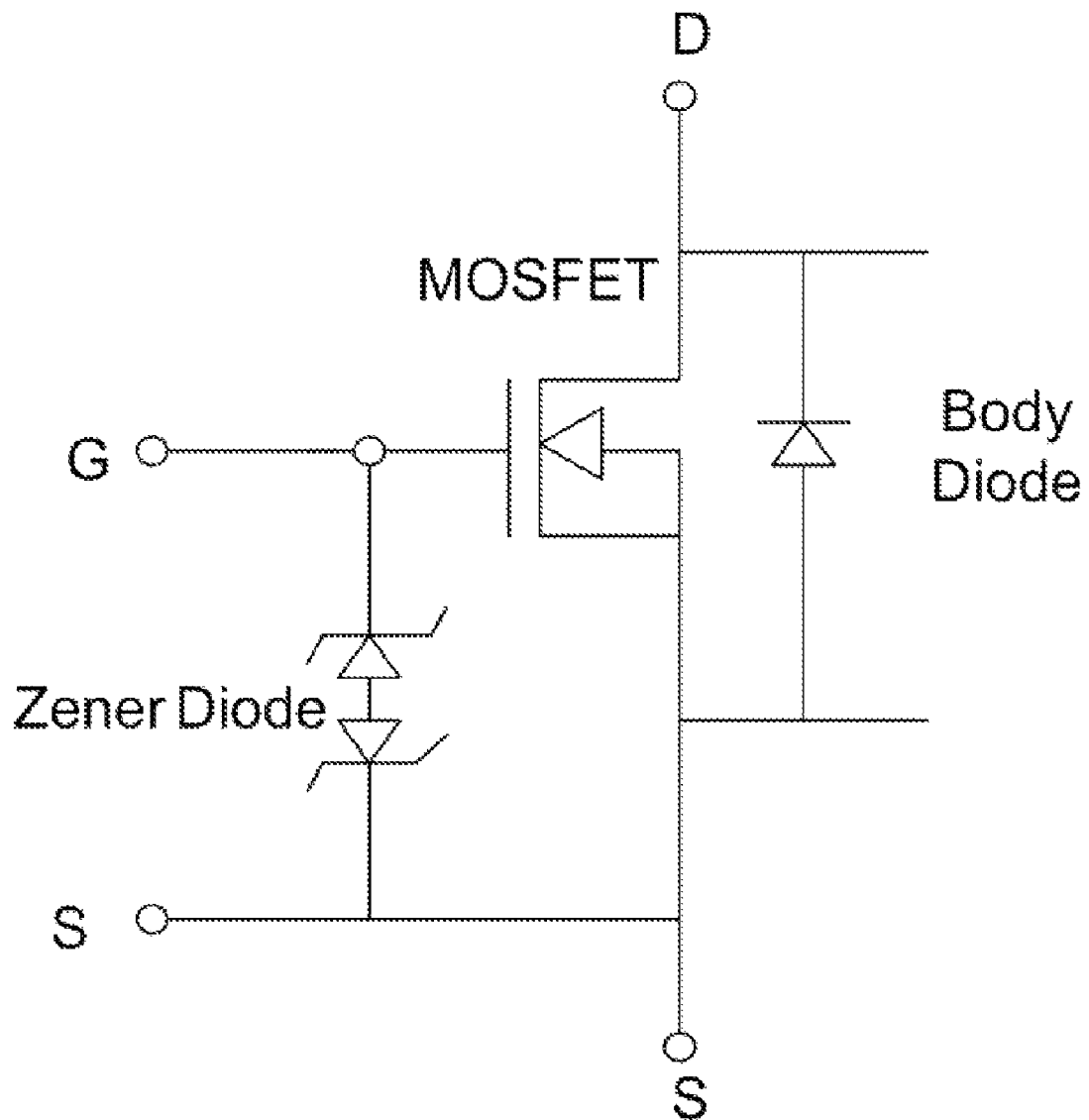
FIG. 1 shows the circuit equivalent for a typical N-channel DMOS in which a back to back Zener diode is located between the source and gate of the DMOS.
Figure 2:
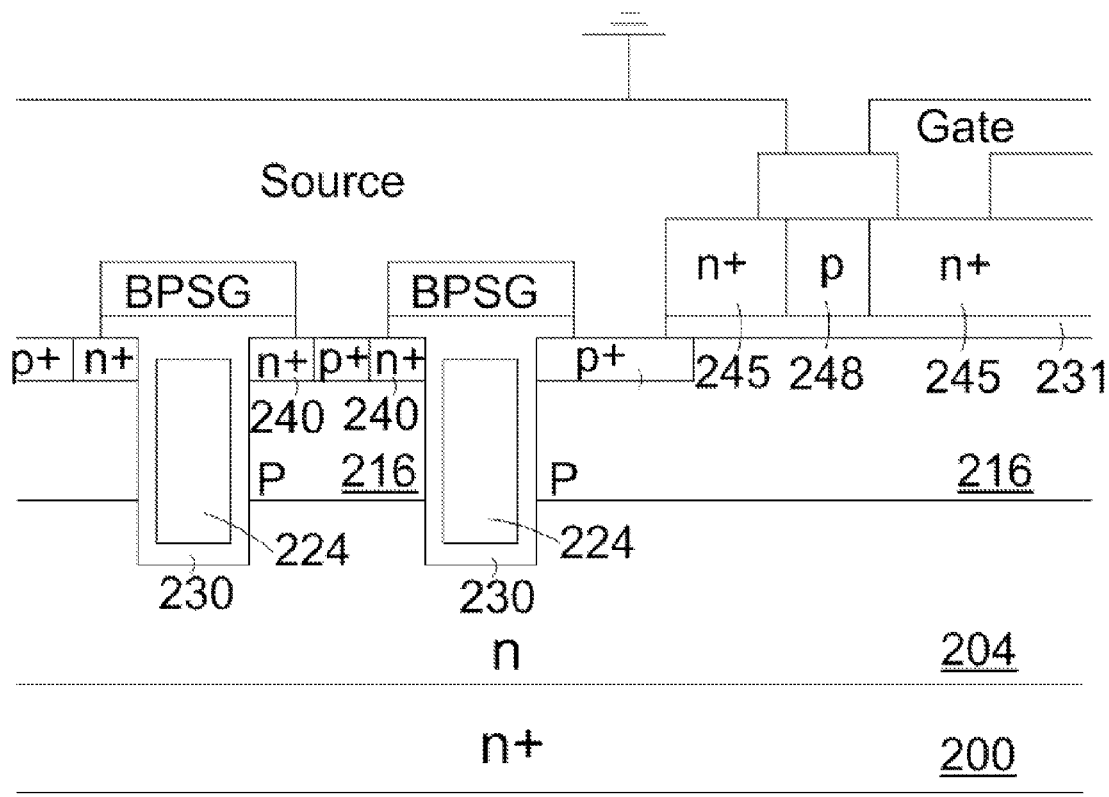
FIG. 2 shows a cross-section of a conventional trench DMOS structure with ESD protection.
Figure 3:
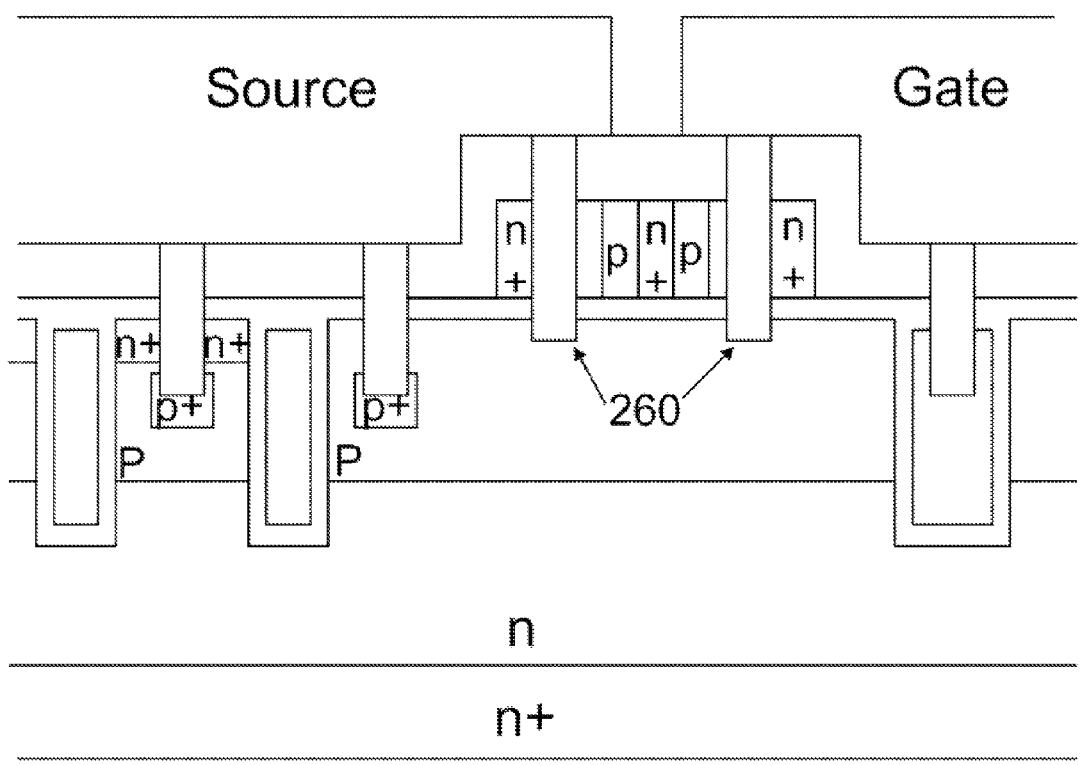
FIG. 3 shows the shortage issue of the conventional trench DMOS structure when trench contacts into epitaxial layer are applied.
Figure 4:
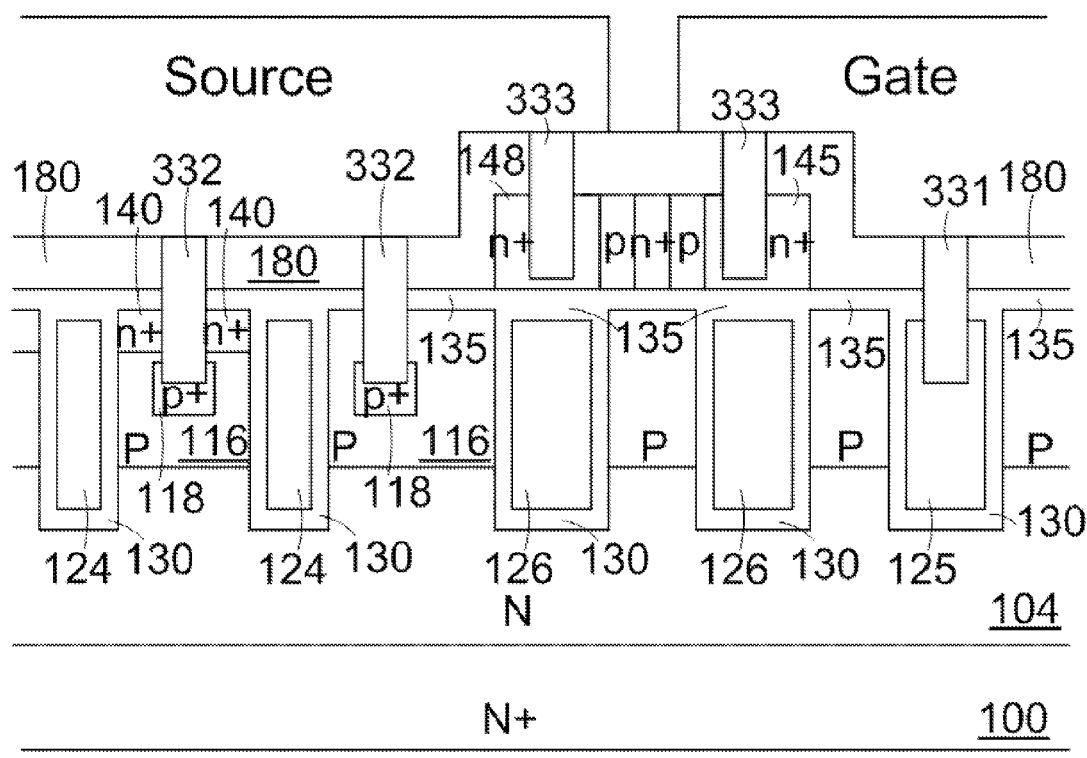
FIG. 4 shows a cross-sectional of trench DMOS structure of this invention.

FIG. 4 illustrates the DMOS structure of this invention in cross-section. The trench DMOS transistor of the present invention provides overvoltage protection compared to the current prior art. As shown in FIG. 4, the N+ substrate 100 has a first conductivity type. The epitaxial layer 104 is deposited on the N+ substrate 100. The body region 116 is disposed within the epitaxial layer 104 having a second conductivity type. The trench MOSFET of the present invention comprises three type function trenched gates which are allocated in the body region 116. The trench MOSFET includes a plurality of first-type function trenched gates 124, at least one second-type function trenched gate 125 and at least two third-type function trenched gates 126 extending through the body region 116 and elongated into the epitaxial layer 104. The first type function trench gates designed for current conduction are located in the active area surrounded by a source region 140 and encompassed in the body region 116 within an epitaxial layer 104. The second type function trenched gates designed for gate metal connection are disposed underneath a gate metal with a gate trenched contacts 331 filled with metal plug 223 (FIG. 6G). The third type function trenched gates are disposed directly and symmetrically underneath the ESD trenched contact areas 333 of anode 145 and cathode 148 in an ESD protection diode, serving as a buffer layer for the prevention of gate-body shortage. The third type function trenched gates are surrounded with the body region 116.

The trench MOSFET transistor of the present invention includes a doped polysilicon layer 152 (FIG. 6G) filled in the first, second and third-type function trenches gates over a gate oxide layer 130 serving as first, second and third type function trench gates. In FIG. 4, the second-type function trench gate with the doped polysilicon layer 152 (FIG. 6C) has gate trenched contact filled with metal plug 223 (FIG. 6G) connecting to the gate metal. The third-type function trench gate is disposed in a manner directly and symmetrically underneath the ESD trenched contact areas of anode 145 and cathode 148 in an ESD protection diode as a buffer layer. The source region 140 of the first conductivity type is encompassed entirely within the body region 116 and is disposed in the active area adjacent to at least one side of the first-type function trenches gates. The insulating layer 135 lining over the first, second and third-type function trenches gates and overlying the body region 116 and the source region 140. The ESD protection diode comprises multiple back to back polysilicon Zener diodes which are disposed on the top of the insulating layer 135 wherein the anode 145 and cathode 148 have ESD trenched contacts 333 filled with the metal plug 223. In the present invention, the width of the trenched contacts is not greater than the third-type function trench gates. The source-body trenched contact is formed between two adjacent first-type function trenches. The source-body trench contact 332 is filled with the metal plug 223 having a heavily doped region 118 surrounding the source-body trenched contact 332 and is allocated below the source region 140, and has a same doping type as the body region 116. The heavily doped region 118 is disposed in a manner spaced apart from the epitaxial layer 104 under the ESD protection diode. In the present invention, the heavily doped region 118 is not disposed into the epitaxial layer 104 under the ESD protection diode.

In FIG. 4, the ESD protection diode comprises cathodes 148 and anode 145. Trench gates are formed underneath contact areas of the ESD protection diode in order to resolve the problems discussed in above prior arts. Besides these, the structure shown in FIG. 4 is advantageous because the source region 140 of the DMOS transistor and n+ cathode regions 148 of the Zener diode can be formed in the same mask and implantation steps, and all the trenches gate can be formed in the same mask and in the same step.

Figure 5:
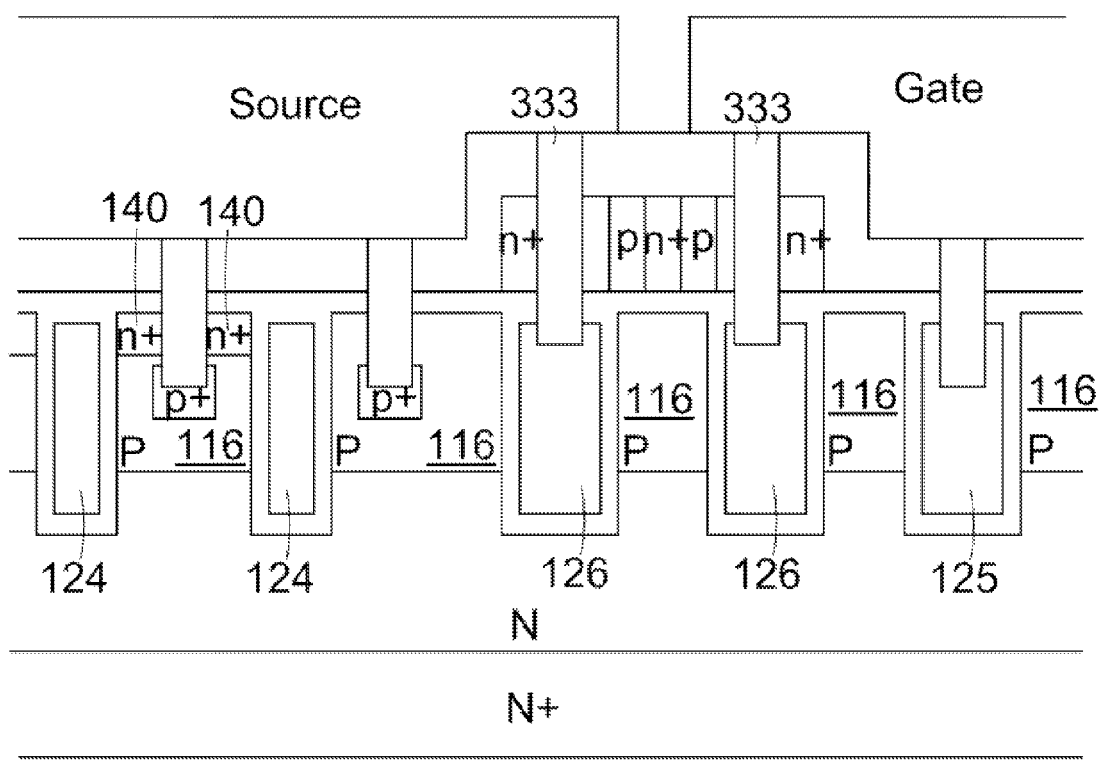
FIG. 5 shows the advantage of the trench DMOS structure of this invention.

FIG. 5 illustrates the function of this invention when trenches are over-etched. The ESD diode does not short to body-source as result of the trench gate underneath the contact area as buffer layer. The ESD diode will touch to the third type function trenched gates 126 underneath without shorting source area.

In the present invention, the depth of the ESD trenched contact can be illustrated in FIG. 4 in which the ESD trenched contacts in the ESD protection diode extend from polysilicon layer 160 (FIG. 6C) of the ESD protection diode onto the insulating layer 135 over said third-type trenched gates without contacting with the third-type function trench gates 126. In other words, the ESD trench contacts are arranged in a manner spaced apart from the third-type function trench gates.

In another embodiment, the trench gates ESD trench contacts are disposed within the polysilicon layer 160 (FIG. 6C) of the ESD protection diode without contacting with the insulating layer 135 as shown in FIG. 4. Still in another embodiment, the ESD trench contacts can be positioned to extend through both the polysilicon layer 160 (FIG. 6C) of the ESD protection diode and the insulating layer 135, and onto the third type function trenched gates as shown in FIG. 5.

Figure 6A:
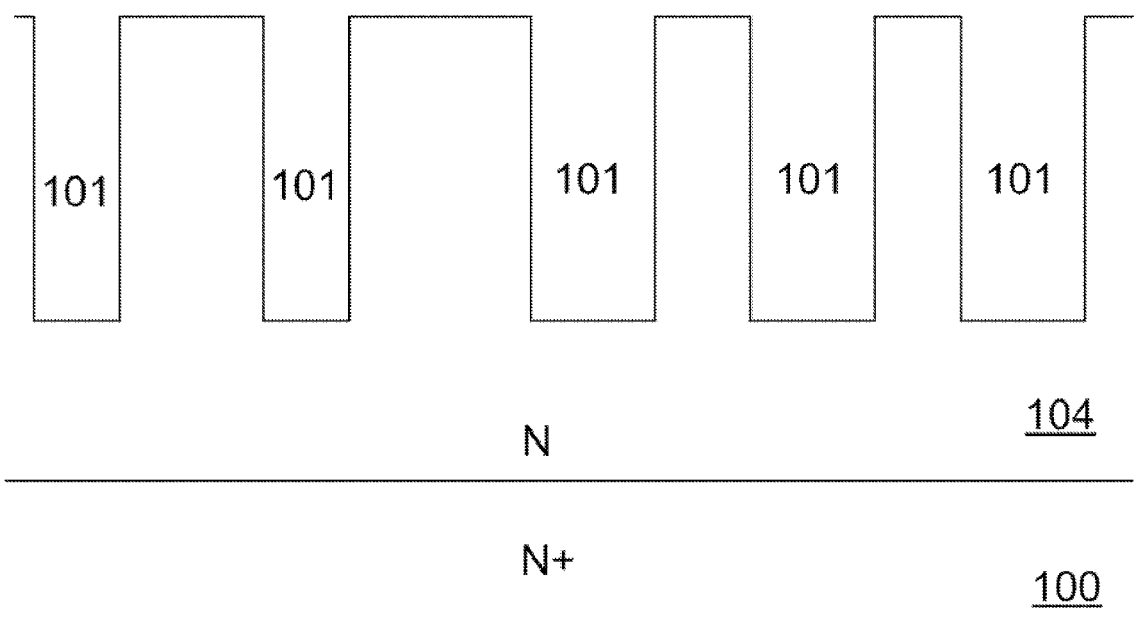
FIGS. 6A to 6G illustrate a sequence of process steps forming a DMOS transistor having overvoltage protection without ESD shorting issues constructed in accordance with the present invention as shown in FIG. 4.
Figure 6B:
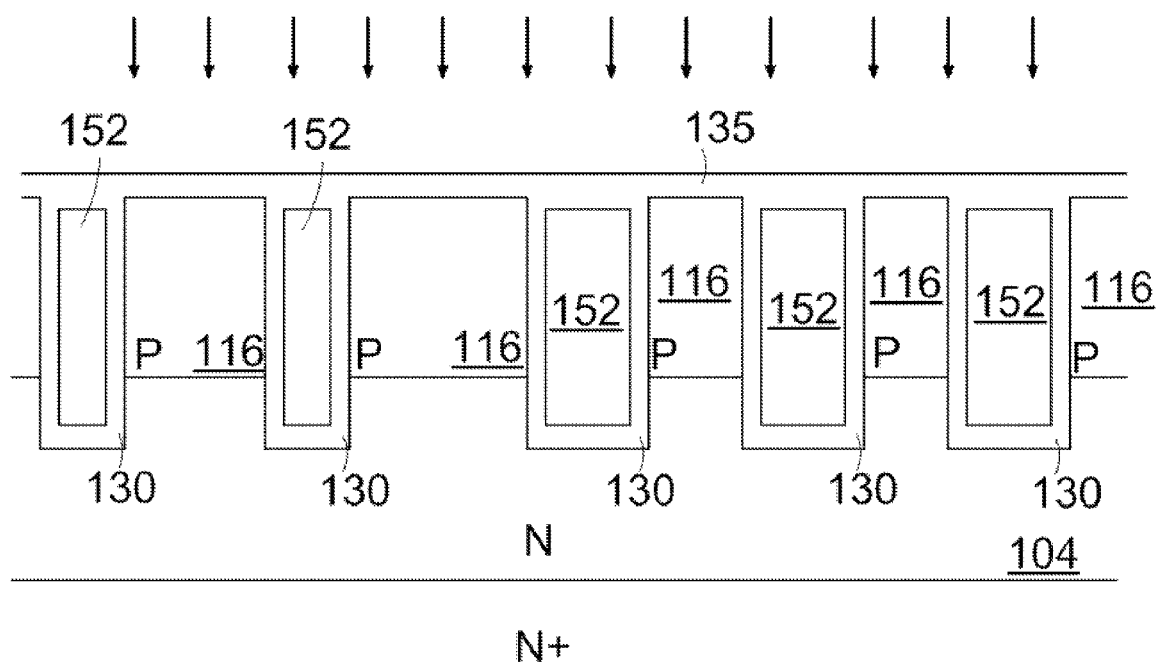
Figure 6C:
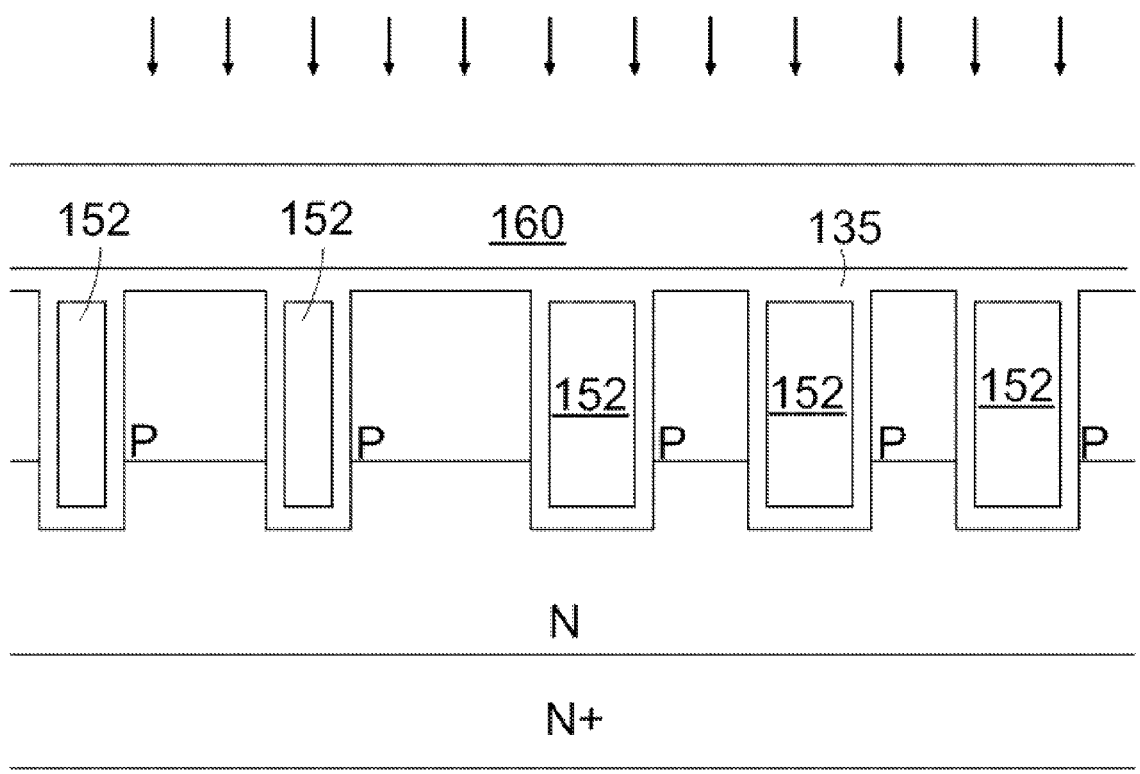
Figure 6D:
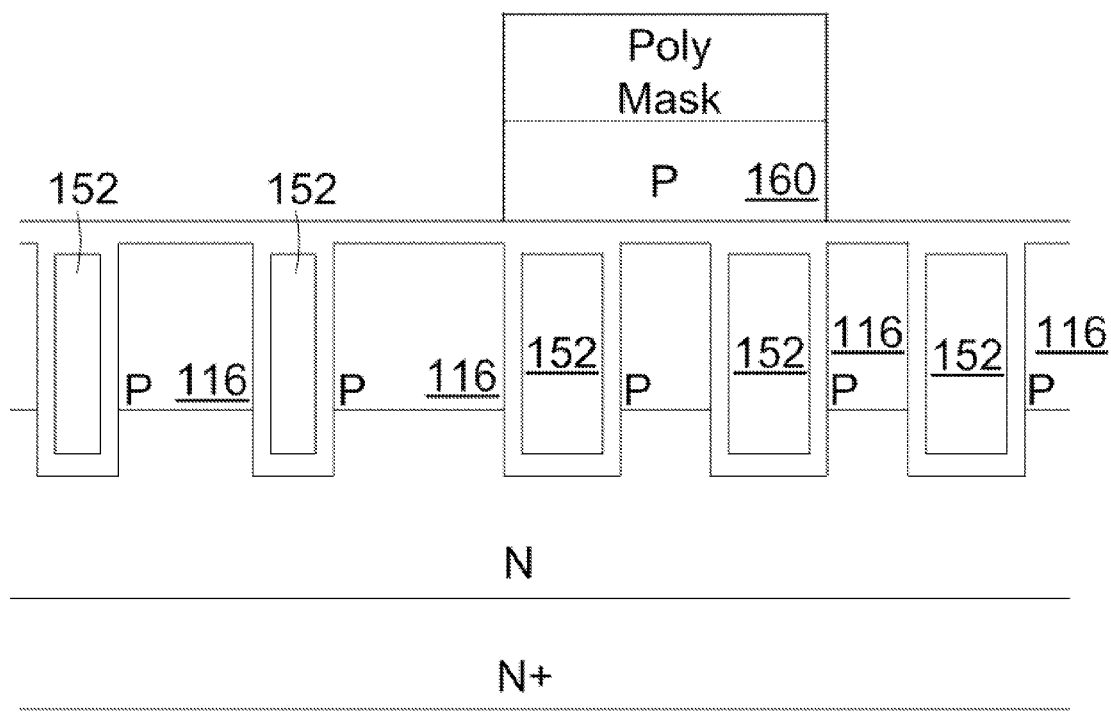
Figure 6E:
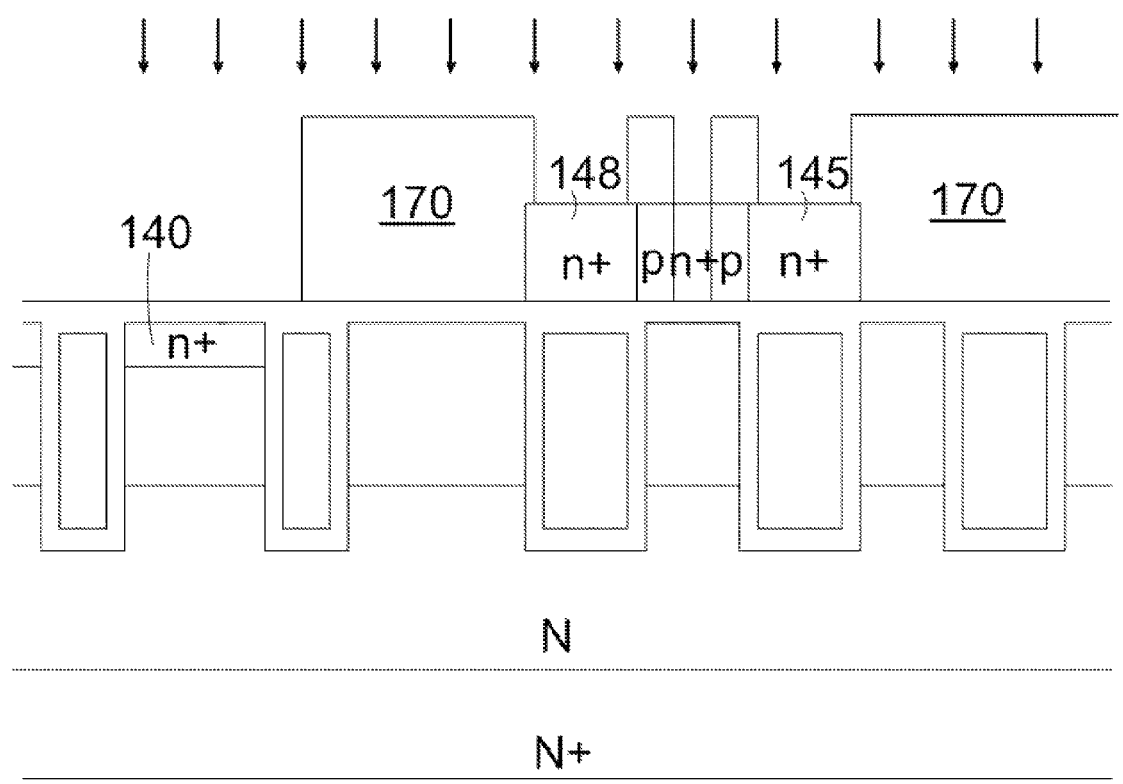
Figure 6F:
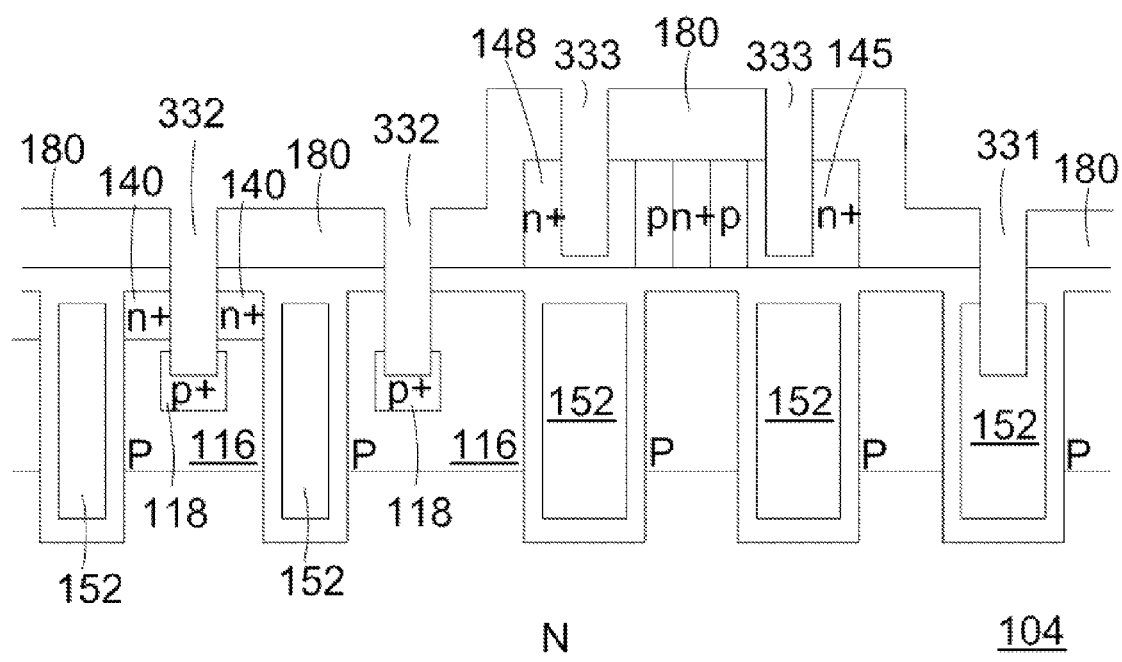
Figure 6G:
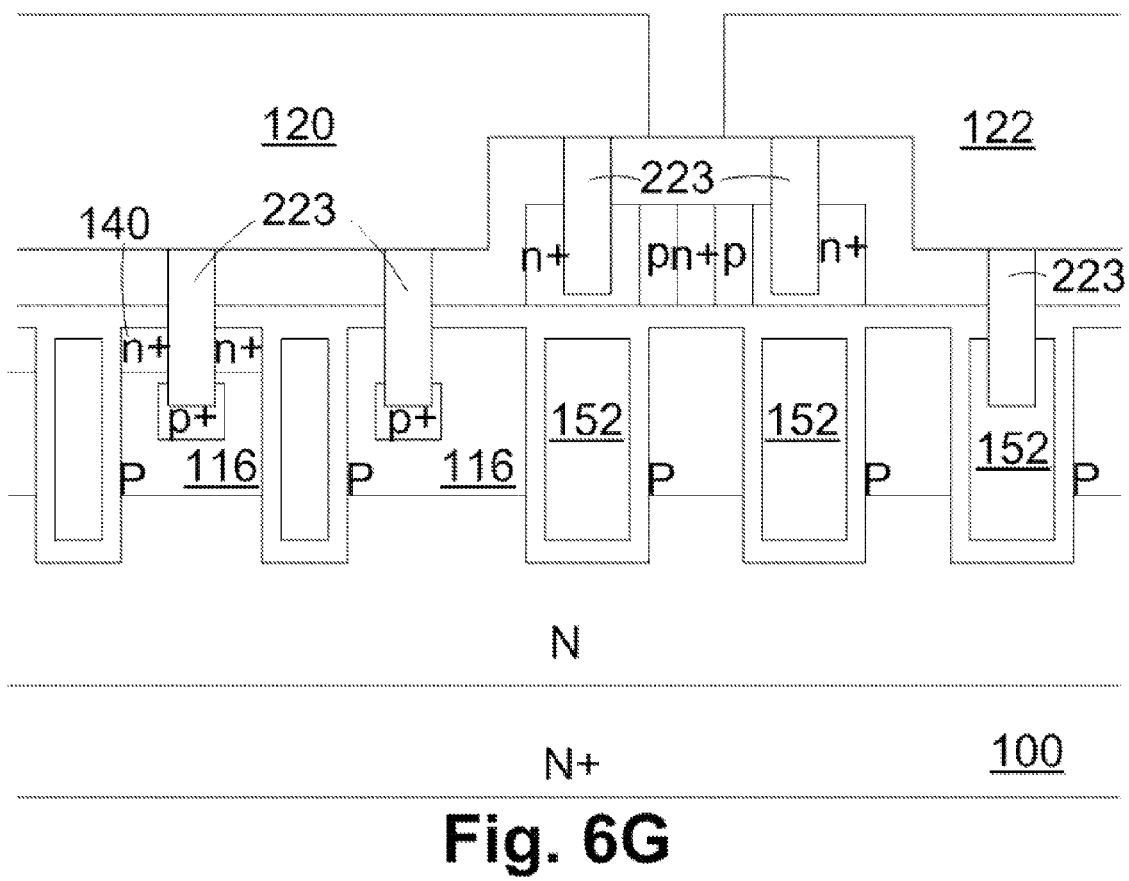

FIGS. 6A-6G show a series of exemplary steps that are performed to form the inventive trench DMOS devices. In FIG. 6A, an N− doped epitaxial layer 104 is grown on a conventionally N+ doped substrate 100. Epitaxial layer 104 is typically 5.5 microns in thickness for a 30V device. A mask layer is formed by covering the surface of epitaxial layer 104 with an oxide layer, which is then conventionally exposed and patterned to leave mask portions. The patterned mask portions define the trench sidewalls. A plurality of trenches 101 are dry Si etched through the mask opening to a depth that typically ranger from 0.9 to 2.5 microns. Then, the mask portion is removed. In FIG. 6B, the gate oxide layer 130 with thickness from 100 to 1000 A is then deposited on the entire structure. Next, the trenches 101 are filled with doped polysilicon 152 to form three type function trenched gates. Then, the polysilicon 152 is etched back to expose the portion of the gate oxide layer 130 that extends over the surface of P-body 116, that followed by a step of P-body Ion Implantation, and then the diffusion step for P-body drive-in, and oxidation for formation of oxide layer 135 over the doped polysilicon 152.

In FIG. 6C, the undoped polysilicon layer 160 is deposited over the oxide layer 135. The undoped polysilicon layer 160, which defines the layer in which the ESD protection diode will be formed, typically has a thickness in the range of 5,000 to 10,000 angstroms. Then a step of blank Boron Ion Implantation is implemented.

In FIG. 6D, the doped polysilicon layer 160 is etched back with a poly mask so that it is completely removed from the region in which the DMOS transistor is defined. That is, doped polysilicon layer 160 is removed in such a way that it does not overlie the trench and body regions of the DMOS. Accordingly, the doped polysilicon layer 160 only remains in the region in which the ESD protection diode will be formed.

Next, in FIG. 6E, a photoresist masking process is used to form patterned masking layer 170. Patterned masking layer 170 defines source regions 140 of the trench DMOS transistor and n+ cathode regions 145 of the Zener diode. Source and cathode regions 140 and 148 are then formed by an Arsenic implantation and diffusion process. After implantation, the Arsenic is diffused to a depth of approximately 0.3~0.5 microns.

In FIG. 6F, the masking layer 170 is removed in a conventional manner and a layer of oxide 180 is deposited over the structure to define oxide regions associated with the source and gate electrode. Then, a contact mask is used to define contact areas. After exposed, ESD trenched contacts 333, gate trenched contact 331 and source-body trenched contacts 332 are formed by dry oxide and Si etched. Finally, a step of Boron Ion Implantation is implemented to form P+ 148 around the contact trench bottom for achieving ohmic contact between P-body and metal plug filled into the trench contacts 333.

In FIG. 6G, a Ti/TiN/W layer is deposited onto the top layer that filled in the contact as the metal plug 223 in ESD trenched contacts 333, gate trenched contact 331 and source-body trenched contacts 332. Then a tungsten etch is carried out to etch back the tungsten layer and a layer of metal 225 is deposited over the top surface and a metal mask is applied to carry out a metal layer followed by a dry metal etch via metal mask. And the final structure is finished.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench DMOS transistor having overvoltage protection, comprising:
   a substrate having a first conductivity type;
   an epitaxial layer grown on said substrate;
   a body region disposed within said epitaxial layer having a second conductivity type, comprising a plurality of first-type function trenched gates, at least one second-type function trenched gate and at least two third-type function trenched gates extending through said body region and into said epitaxial layer;
   a doped polysilicon layer filled in said first, second and third-type function trenched gates over a gate oxide served as said first, second and third type function trenched gates;
   wherein said second-type function trench gate with said doped polysilicon layer having gate trenched contact filled with metal plug connecting to gate metal;
   wherein said third-type function trench gate is disposed in a manner directly and symmetrically underneath the ESD trenched contact areas of anode and cathode in a ESD protection diode as a buffer layer;
   a source region of said first conductivity type encompassed entirely within said body region disposed in the active area adjacent to at least one side of said first-type function trenches gates;
   an insulating layer lining over said first, second and third-type function trenches gates and overlying said body region and said source region;
   wherein said ESD protection diode comprises multiple back to back polysilicon Zener diodes disposed on top of said insulating layer wherein said anode and cathode areas have ESD trenched contacts filled with said metal plug, having trench width of said trenched contacts not greater than that of said third-type function trench gates; and a source-body trenched contact formed between two adjacent said first-type function trenches filled with said metal plug having a heavily doped region surrounding said source-body trenched contact below said source region with a same doping type as said body region; wherein said heavily doped region is disposed in a manner spaced apart from said epitaxial layer under said ESD protection diode.

2. The transistor of claim 1, wherein said insulating layer has a thickness ranging from 150 angstroms to 1500 angstroms.

3. The transistor of claim 1 further comprises a drain electrode disposed on the bottom surface of said substrate.

4. The transistor of claim 1 further comprises a source electrode contacted to said source region and said body region.

5. The transistor of claim 1, wherein said ESD trenched contacts extend from said ESD protection diode onto said insulating layer over said third-type function trench gates wherein said ESD trench contacts are arranged in a manner spaced apart from said third-type function trench.

6. The transistor of claim 1, wherein said ESD trenched contacts are disposed within said ESD protection diode and arranged in a manner spaced apart from said insulating layer and over said third-type function trenched gate.

7. The transistor of claim 1, wherein said ESD trench contacts penetrates through each of said ESD protection diode and said insulating layer and extends into said third-type function trenched gate.

* * * * *